(12) United States Patent
Roth

(10) Patent No.: US 6,317,001 B1
(45) Date of Patent: Nov. 13, 2001

(54) COMPENSATION OF TIMING ERRORS CAUSED BY DYNAMIC THERMAL MISMATCH

(75) Inventor: Bernhard Roth, Boeblingen (DE)

(73) Assignee: Agilent Technologies, Inc., Loveland, CO (US)

( * ) Notice: Subject to any disclaimer, the term of this patent is extended or adjusted under 35 U.S.C. 154(b) by 0 days.

(21) Appl. No.: 09/453,187

(22) Filed: Dec. 2, 1999

(30) Foreign Application Priority Data

Feb. 10, 1999 (EP) .................................................. 99102490

(51) Int. Cl.[7] ................................. H03F 3/04; H03F 3/45
(52) U.S. Cl. ............................................. 330/289; 330/256
(58) Field of Search ..................................... 330/289, 256

(56) References Cited

U.S. PATENT DOCUMENTS

| 5,250,911 | 10/1993 | Linder et al. . |
| 5,506,536 | 4/1996 | Yeung . |
| 5,512,858 | * 4/1996 | Perrot ................................. 330/256 |
| 5,757,234 | * 5/1998 | Lane ................................. 330/256 |

FOREIGN PATENT DOCUMENTS

| 2316559A | 1/1997 | (GB) . |
| 04192715 | 10/1992 | (JP) . |

OTHER PUBLICATIONS

European Search Report, EP 99 10 2490, Jun. 10, 1999.

* cited by examiner

*Primary Examiner*—Robert Pascal
*Assistant Examiner*—Patricia T. Nguyen

(57) ABSTRACT

Disclosed is a compensation circuit for compensating a change in timing information of an input signal caused by thermal variations in a first circuit. The first circuit comprises one or more devices each having a temperature dependent on the input signal. Accordingly, the compensation circuit comprises one or more compensation devices each having a temperature dependent on the input signal. The compensation circuit is connected in series with the first circuit and the series connection receives the input signal and provides a timing-compensated output signal with substantially the same timing information as of the input signal. The thermal characteristic of at least one of the one or more compensation devices is proportional or in some other known relation to a corresponding one of the one or more devices of the first circuit. The compensation circuit provides a compensation output signal having substantially opposite or inverse thermal distortions than the first circuit.

24 Claims, 11 Drawing Sheets

COMPENSATION OF TIMING ERRORS CAUSED BY DYNAMIC THERMAL MISMATCH

BACKGROUND OF THE INVENTION

The present invention relates to the compensation of a change in timing information caused by thermal variations, and in particular relates to differential amplifiers.

Most electronic circuits appear to be sensitive on thermal variations caused mainly by variations in ambient temperature or by dynamic behavior due to power consumption. In particular, different thermal variations at different locations of electronic circuits often lead to an unwanted behavior of the circuit.

In digital systems, information is mainly transmitted or processed by means of signals changing from one state to another. Timing information comprises the information about when a signal is due to change. A digital circuit, which is processing or transmitting timing information, generates a sequence of output state transitions as a result of a sequence of input state transitions. The relationship between timing information of input transitions must be reflected at the output of the system. Furthermore, the time elapsing between input state changes should also elapse between output state changes caused by their respective input state changes. Otherwise, the system has changed the timing information, which should be avoided in most applications.

UK-A-2316559 discloses a temperature compensated driver circuit that is relatively stabilized in waveform amplitude and output timing by detecting the power consumption of its output driver stage and correcting and controlling the power consumption. A temperature detector detects the temperature changes of output elements and a temperature compensator adjusts the timing of an output signal against an input signal in response to a temperature-detecting signal from the temperature detector. This, in particular, allows compensating timing deviations due to a temperature-induced variation of a pulse delay time.

In digital circuits, it has been observed that thermal variations can lead to a timing drift dependent on the duty cycle as the ratio of the sum of all pulse durations to the total period. Most conventional circuits are therefore designed to provide a good thermal coupling between corresponding components which has been shown to reduce this so-called duty cycle drift, i.e. the variation of the propagation delay dependent on the duty cycle, from e.g. 2 ns to 0.5 ns. In modern digital applications, however, thermal coupling has proved not to be sufficient to reduce the duty cycle drift e.g . down to values of 100 ps or smaller. Furthermore, for physical reasons it is clear that an ideal thermal coupling will never be possible, so that thermal coupling, even if significantly improved, will always have a natural limitation.

As apparent from the above said, it is clear that a timing information, such as the duty cycle drift or variations in the delay time as explained in GB-A-2316559, can be changed by thermal variations.

SUMMARY OF THE INVENTION

It is therefore an object of the present invention to provide an improved compensation of thermal variations, preferably for maintaining timing information in digital systems unchanged. This object is solved by the independent claims. Preferred embodiments are shown by the dependent claims.

For a better understanding of the compensation of thermal effects as carried out by the invention, a new theoretical model explaining the effect of thermal variations shall be developed. This model will be illustrated for the example of a differential amplifier as depicted in FIG. 1 which is well-known in the art, with fixed input and output levels, as used e.g. in digital circuits.

The differential amplifier receives differential input signals IN and NIN and provides differential outputs OUT and NOUT. The signal NIN represents the complement to the signal IN and, accordingly, the signal NOUT represents the complement to the signal OUT. The constitution and functioning of differential amplifiers is well known in the art and needs not to be explained herein in detail.

In the example of FIG. 1, the differential amplifier is built up of two NPN transistors Q1 and Q2 with common emitters coupled to a current source I1. The input signals IN and NIN are respectively coupled to the base of the transistors Q1 and Q2. The collectors of the transistors Q1 and Q2 are coupled via impedances R to a source of high potential VCC and respectively represent the output signals OUT and NOUT.

In a logical 'low' state (i.e. when IN=low and NIN=high), the transistor Q1 is off so that the power dissipation Pd1_lo of the transistor Q1 is zero. Transistor Q2 is on, leading to a power dissipation Pd2_lo of the transistor Q2 with:

$$Pd2\_lo = I1 \cdot VCE2\_lo$$
$$= I1 \cdot (VCC - R \cdot I1 - VE)$$
$$= I1 \cdot (VCC - R \cdot I1 - (Vnin\_lo - VBE2))$$

whereby VCE2_lo represents the collector-emitter voltage of transistor Q2 and VE represents the voltage at the coupled emitters. Vnin_lo is the voltage at the base of transistor Q2 and substantially represents the logic 'high' potential, and VBE2 is the base-emitter voltage of transistor Q2.

In a logical 'high' state (with IN=high and NIN=low), transistor Q1 is on, leading to a power dissipation Pd1_hi thereof with:

$$Pd1\_hi = I1 \cdot VCE1\_hi$$
$$= I1(VCC - R \cdot I1)$$
$$= I1(VCC - R \cdot I1 - (Vin\_hi - VBE1))$$

wherein VCE1 represents the collector-emitter voltage of transistor Q1. Vin_hi is the voltage at the base of transistor Q1 and substantially represents the logic 'high' potential, and VBE1 is the base-emitter voltage of transistor Q1. Since the transistor Q2 is turned off, the power dissipation Pd2_hi is zero.

Assuming that the applied logic potential are substantially equal with:

$$Vnin\_lo = Vin\_hi$$
$$Vnin\_hi = Vin\_lo$$

and further that the transistors Q1 and Q2 are substantially equal, so that:

$$VBE = VBE2\_lo = VBE1\_hi$$
$$VCE = VCE2\_lo = VCE1\_hi$$
$$Pd2\_hi = Pd1\_lo = 0$$
$$Pd = Pd2\_lo = Pd1\_hi$$

leading to:

$$Pd1\_hi - Pd1\_lo = Pd = I1 \cdot (VCC - R \cdot I1 - (Vin\_hi - VBE)) \quad \text{eq. 1}$$

$$Pd2\_hi - Pd2\_lo = -Pd = -I1 \cdot (VCC - R \cdot I1 - (Vin\_hi - VBE)) \quad \text{eq. 2,}$$

whereby Pd represents the power dissipation of either transistor Q1 or Q2 when switched on.

FIG. 2 shows a thermal representation of the two transistors Q1 and Q2 in the differential amplifier of FIG. 1. In analogy to the 'electrical world', the thermal representation of the power dissipation Pd by the transistors Q1 and Q2 can be represented as current sources Pd1 and Pd2 respectively feeding currents into an RC network. Thermal resistors Rth correspond to ohmic resistors, thermal capacitances Cth correspond to electrical capacitances, and the temperature corresponds to a voltage. Therefore, Ohm's law (V=I·R) can be represented thermally as: Temp=Pd·Rth.

A resistor Rth1 represents the thermal flow between the transistors Q1 and Q2. Thermal resistors Rth2 in parallel to thermal capacitances Cth represent the thermal flow of the transistors towards the ambient world, whereby the thermal capacitances Cth reflect the limited speed of temperature distribution. When the transistors Q1 and Q2 change their power dissipation Pd, the actual temperature of the transistors cannot follow immediately, but will follow in some sort of low pass function with a thermal time constant Tth. For the sake of simplicity, it is assumed that transistors Q1 and Q2 are substantially equal and built up accordingly, so that each transistor has the thermal resistor Rth2 in parallel to the thermal capacitances Cth, thus representing the thermal flow towards the ambient world.

In the logical "low" state (with IN=low and NIN=high, thus leading to transistor Q1 being off and the power dissipation Pd1_lo thereof being zero, Pd1_lo=0), the following equations can be given:

$$Temp2\_lo = Pd2\_lo \cdot (Rth2 \| (Rth1 + Rth2))$$
$$= Pd2\_lo \cdot Rth2 \cdot (Rth1 + Rth2)/(2 \cdot Rth2 + Rth1)$$
$$Temp1\_lo = Temp2\_lo \cdot Rth2/(Rth1 + Rth2)$$
$$= Pd2\_lo \cdot Rth2 \cdot Rth2/(2 \cdot Rth2 + Rth1)$$

thus defining a temperature difference dTemp_lo in the low-state:

$$dTemp\_lo = Temp2\_lo - Temp1\_lo$$
$$= Pd2\_lo \cdot Rth1 \cdot Rth2/(2 \cdot Rth2 + Rth1)$$

In the logical "high" state (IN=high and NIN=low, thus leading to transistor Q2 being off and the power dissipation Pd2_hi thereof being zero, Pd2_hi=0), the following equations can be given:

$$Temp1\_hi = Pd1\_hi \cdot (Rth2 \| (Rth1 + Rth2))$$
$$= Pd1\_hi \cdot Rth2 \cdot (Rth1 + Rth2)/(2 \cdot Rth2 + Rth1)$$
$$Temp2\_hi = Temp1\_hi \cdot Rth2/(Rth1 + Rth2)$$
$$= Pd1\_hi \cdot Rth2 \cdot Rth2/(2 \cdot Rth2 + Rth1)$$

thus defining a temperature difference dTemp_hi in the high-state:

$$dTemp\_hi = Temp2\_hi - Temp1\_hi$$
$$= -Pd1\_hi \cdot Rth1 \cdot Rth2/(2 \cdot Rth2 + Rth1)$$

With the assumptions that Pd1_hi=Pd2_lo=Pd and Pd2_hi Pd1_lo=0, the temperature difference, and accordingly the difference in power dissipation, between both logic states are:

$$Temp1\_hi - Temp1\_lo = Pd \cdot Rth1 \cdot Rth2/(2 \cdot Rth2 + Rth1) \quad \text{eq. 3}$$

$$Temp2\_hi - Temp2\_lo = -Pd \cdot Rth1 \cdot Rth2/(2 \cdot Rth2 + Rth1) \quad \text{eq. 4}$$

The thermal time constant Tth represents the time constant of an exponential function which describes the difference between the temperatures Temp1 and Temp2 when Pd1 and/or Pd2 changes, with:

$$Tth = Cth \cdot (Rth1 \cdot Rth2)/(2 \cdot Rth1 + Rth2) \quad \text{eq. 5}$$

FIG. 3 shows the static behavior of the differential amplifier of FIG. 1 when transistors Q1 and Q2 have different temperatures. Except for the case that the temperatures Temp1 and Temp2 of the transistors Q1 and Q2 are equal, the differential amplifier acts as if there were an offset voltage Vos. The output signal OUT−NOUT is zero when the input signal IN−NIN is positive with an offset voltage Vos=Vo (for Temp1<Temp2), or negative with an offset voltage Vos=−Vo (for Temp1>Temp2). This is since silicon diodes normally have a negative temperature coefficient so that the voltage gets smaller when the temperature rises.

There are other properties of the transistors Q1 and Q2 that change with temperature, such as capacitances, the current amplification factor b, or the transit frequency ft. The change in the base emitter voltage VBE, however, showed up to represent the biggest source of error in this kind of application. That means that other effects can be basically neglected and it can be assumed that the propagation delay, as the time of the crossing point of the input signals (when IN−NIN=Vos) to the time of the crossing point of the output signals (when OUT−NOUT=0), is not dependent on the temperature, but represents a fixed propagation time Tpd of the differential amplifier.

When changing the logic state of the input signal and thus of the output signal, the offset voltage Vos dynamically changes (with the time constant Tth) as depicted in FIG. 4A.

The actual difference between the input signal IN−NIN and the offset voltage Vos (cf. FIG. 4A) shows some kind of low pass characteristic as apparent from FIG. 4B. It is noted that the voltage differences (IN−NIN)−Vos as illustrated in FIG. 4B does not represent a physical signal which can be measured in the circuit of FIG. 1. This voltage difference shown in FIG. 4B only represents a useful tool for better understanding the principle of the invention and can be understood as the "effective signal" at the input of the differential amplifier.

FIGS. 5A and 5B depict the dynamic behavior of an input pulse with a pulse width PWin which is much smaller than the thermal time constant Tth of the differential circuit according to FIG. 1. FIG. 5A shows an example of a short positive input pulse, whereas FIG. 5B depicts the behavior of a short negative input pulse. The principles are the same as well for the positive as for the negative pulse, so that FIGS. 5A and 5B shall be explained together. In both cases, the input pulse (represented by the input signals IN, NIN, and IN−NIN) follows after a significant long time (>>Tth) of static low state, so that it can be assumed that transistor Q1 is in its 'cold' state while transistor Q2 is in its 'hot' state.

Due to the offset voltage Vos, the differential amplifier will not immediately switch when IN−NIN=0, but first when the input signal IN−NIN=Vo (in FIG. 5B: IN−NIN=−Vo). From this point in time, it takes the normal propagation time Tpd of the differential circuit until the output signal OUT−NOUT=0. Since the condition IN−NIN=Vo (in FIG. 5B: IN−NIN=−Vo) is fulfilled after the nominal crossing point when IN−NIN=0 while going from low to high (in FIG. 5B: from high to low) and, accordingly, before the nominal crossing point when IN−NIN=0 while going from high to low (in FIG. 5B: from low to high), an effective propagation delay Tpdlh of the low-to-high transition (positive transition) is longer (in FIG. 5B: shorter) than an effective propagation delay Tpdhl of the high-to-low transition (negative transition). Variations in the effective propagation delay between positive and negative transition and also between positive and negative pulses, however, lead to a change of the output pulse width PWout with PWout<PWin, thus resulting in a change in the timing information.

From FIGS. 5A and 5B, the effect of an offset voltage Vos becomes readily apparent in that the pulse width of the output signal is changed with respect to the pulse width of the input signal due to differences between the propagation delay for a negative and a positive transition (dependent on the polarity of the pulse). This effect of a change of the pulse width, however, is reproducible as long as the offset voltage remains constant.

From the previously mentioned, in particular with respect to FIGS. 4A and 4B, however, it has become apparent that the offset voltage Vos changes over the time under the influence of a change in the temperature. The temperatures of each device, and accordingly the temperatures between devices, on the other hand, depend on the succession of signals applied to the respective devices, and thus, on the power dissipation prior to the respective switching point. Therefore, the effective propagation delay of each transition becomes dependent on the "history" of preceding signals. It goes without saying that such a data or history dependency leads to an entirely non-reproducible modification of the timing information which cannot be accepted in particular in timing critical applications. In a typical application, such data-dependent temperature effect is not predictable, thus leading to 'data-dependent jitter' which decreases the performance of critical digital system designs and the timing accuracy in particular of test and measurement systems such as digital automated test equipment (ATE). Moreover, since isolated short pulses are shortened even more (cf. FIGS. 5A and 5B), there is a bandwidth-limiting effect.

In FIGS. 5A and 5B, the change of the offset voltage Vos is depicted with respect to a zero-offset situation. Since the pulses in FIGS. 5A and 5B are selected to be relatively short with respect to the pulse shown in FIG. 4A, the change in the offset voltage Vos in FIGS. 5A and 5B is relatively low with respect to FIG. 4A.

As apparent from the above explanations with respect to FIGS. 1 to 5B, a modification of the timing information and thus a timing error in the differential amplifier of FIG. 1 directly depends on:

the slew rate (i.e. the speed of a transition, usually expressed in V/ns) of the input signal IN−NIN, the thermal coupling of the two transistors Q1 and Q2, the power dissipation of the respective transistor Q1 or Q2 when being turned on, and the base-emitter voltage change with the temperature.

With increasing slew rate, the effect of the offset voltage decreases so that, in turn, the effect on the timing information decreases. The recent advances in IC technology with more speed capabilities have increased the slew rate, whereby the price for faster transistors is paid by smaller geometries and smaller capacitances (e.g. due to increased trench isolation), thus increasing thermal resistance which again offsets the effect of the faster slew rates.

The effect of a variation of the propagation delays, and thus of the change in the pulse width, has been observed in the art and generally addressed to a variation in an offset voltage, whereby it has not been known how to explain and describe this effect. One approach to overcome the effect of the varying offset voltage has been in the Hewlett-Packard HP 83000 by superimposing another voltage to compensate the offset voltage. Circuits for compensating offset voltages are well known in the art and disclosed e.g. in U.S. Pat. Nos. 4,464,631, 4,717,888, 4,827,222, 5,045,806, 5,132,559, 5,812,005, or 4,987,327. It has been tried to actively add voltages to the input or output signal, which were intended to introduce such a timing error, however, in the opposite direction. The problem in all such efforts, however, has been the difficulty of determining and controlling the amount of compensation. Sophisticated testing methods are required to assess the effect of the timing error and, accordingly, sophisticated circuits are required, on the other hand, to provide the respective compensation voltages. It is easy to understand, that this kind of effect-based compensation cannot be regarded as being satisfactory and has also introduced the possibility that a wrong "compensation" adds a further timing error to the signals.

The present invention provides an improved compensation of thermal effects on timing information.

FIGS. 6A and 6B depict in general block diagrams the principle of a circuit structure according to the invention for compensating signal distortions caused by components having a signal-dependent temperature.

FIG. 6A shows the structure of a circuit C1 without compensation. As external signals, the circuit C1 receives an input signal SIG_IN and provides an output signal SIG_OUT. A signal SIN represents one or more internal signals derived from the input signal SIG_IN, and a signal Sout represents one or more internal output signals providing the external output signal SIG_OUT. The circuit C1 further comprises one or more devices Di (with i=1 . . . n), each having a respective temperature Ti (with i=1 . . . n), whereby the respective temperature Ti, and/or a respective temperature difference between one or more of the devices D1 . . . Dn, are/is dependent on the applied internal input signal Sin. Thus, each device Di exhibits a signal-dependent temperature Ti=fi(Sin).

FIG. 6B depicts the principle of the signal compensation according to the invention. An additional compensation circuit C2 is connected in series with the circuit C1 to be compensated. Corresponding to the circuit C1, the circuit C2 comprises one or more devices Dpi (with i=1 . . . n), each exhibiting a device temperature Tpi (with i=1 . . . n) having a dependency on an applied internal signal Sinc:

$$Tpi=fci(Sinc),$$

whereby the internal signal Sinc is derived from an applied external signal such as SIG_IN in FIG. 6B.

The thermal characteristic of each device Dpi in the circuit C2 is proportional or in some other known relation to a corresponding device Di of circuit C1. The thermal characteristic may represent direct and/or indirect thermal properties. Direct thermal properties are determined by the respective device itself, such as temperature dependencies of the electrical characteristic(s) and/or thermal resistances and/or capacitances, and directly 'originate' from the device.

Indirect thermal properties are determined by the respective device relative to other devices, such as thermal resistances and/or capacitances to other devices and/or the electrical relationship between corresponding devices Dpi and Di.

The circuit C2 is designed in a way that it controls the temperatures Tpi of each device Dpi and/or temperature differences between different devices Dpi and Dpj (with j=1 . . . n and i j), so that the circuit C2 provides an output signal Sig__IN' (depending on the input signal Sig__ IN) having opposite or inverse distortions than the circuit C1. By coupling the circuits C1 and C2 in series, whereby the order of the circuits C1 and C2 can be as shown in FIG. 6B or vice versa, the effect of distortions can be eliminated at the output SIG__OUT at the very end of the series connection of the circuits C1 and C2.

Depending on the type of distortion and the functionality of the circuit C1, one or more output signals SIG__fb may be provided e.g. as feedback signals from the circuit C1 to the compensation circuit C2.

BRIEF DESCRIPTION OF THE DRAWINGS

Other objects and many of the attendant advantages of the present invention will be readily appreciated and become better understood by reference to the following detailed description when considering in connection with the accompanied drawings. Features that are or can be built up substantially equally or similarly are referred to with the same reference sign.

DETAILED DESCRIPTION OF THE INVENTION

Figure 1:
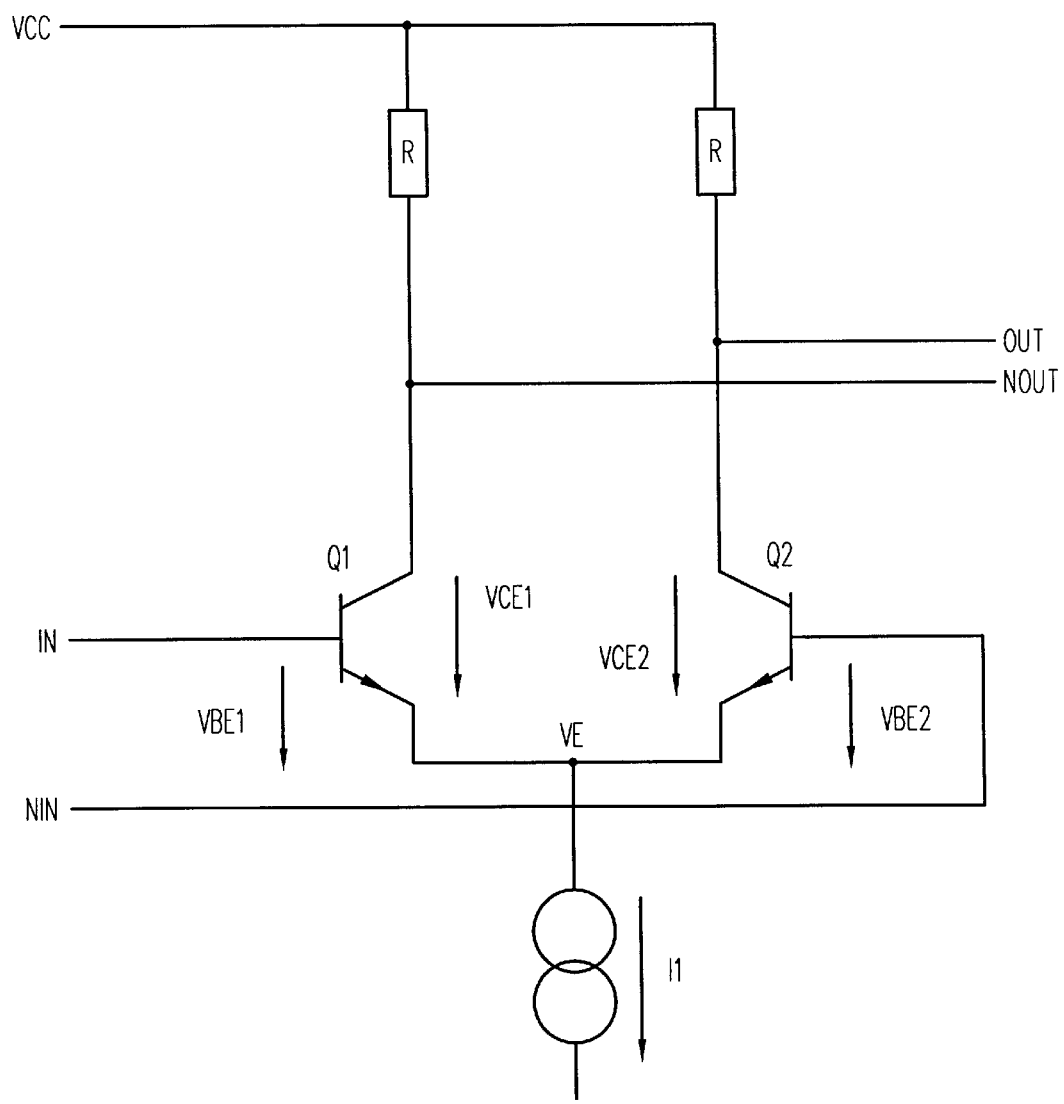
FIG. 1 shows a differential amplifier as known in the art.
Figure 2:
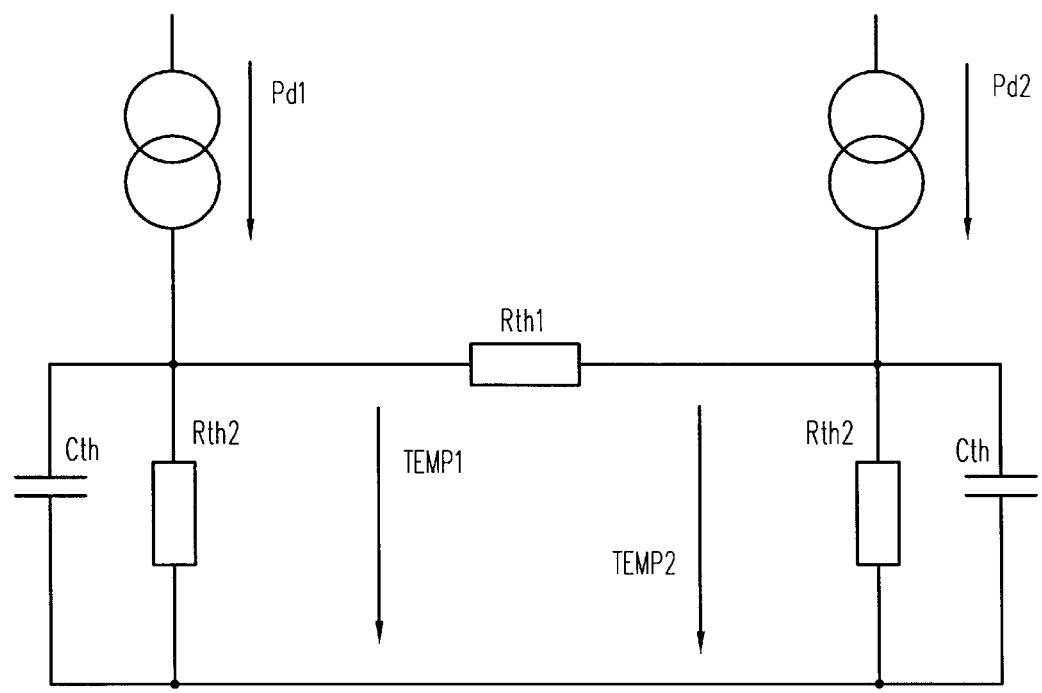
FIGS. 2 and 3 illustrate the thermal representation and the static behavior of the differential amplifier of FIG. 1, FIGS. 4A and 4B represent actual and virtual signals in the differential amplifier of FIG. 1, FIGS. 5A and 5B depict the dynamic behaviors of input pulses with pulse widths much smaller than the thermal time constant of the differential circuit according to FIG. 1, FIGS. 6A and 6B depict the principle of a circuit structure according to the invention for compensating signal distortions caused by components having a signal-dependent temperature.
Figure 3:
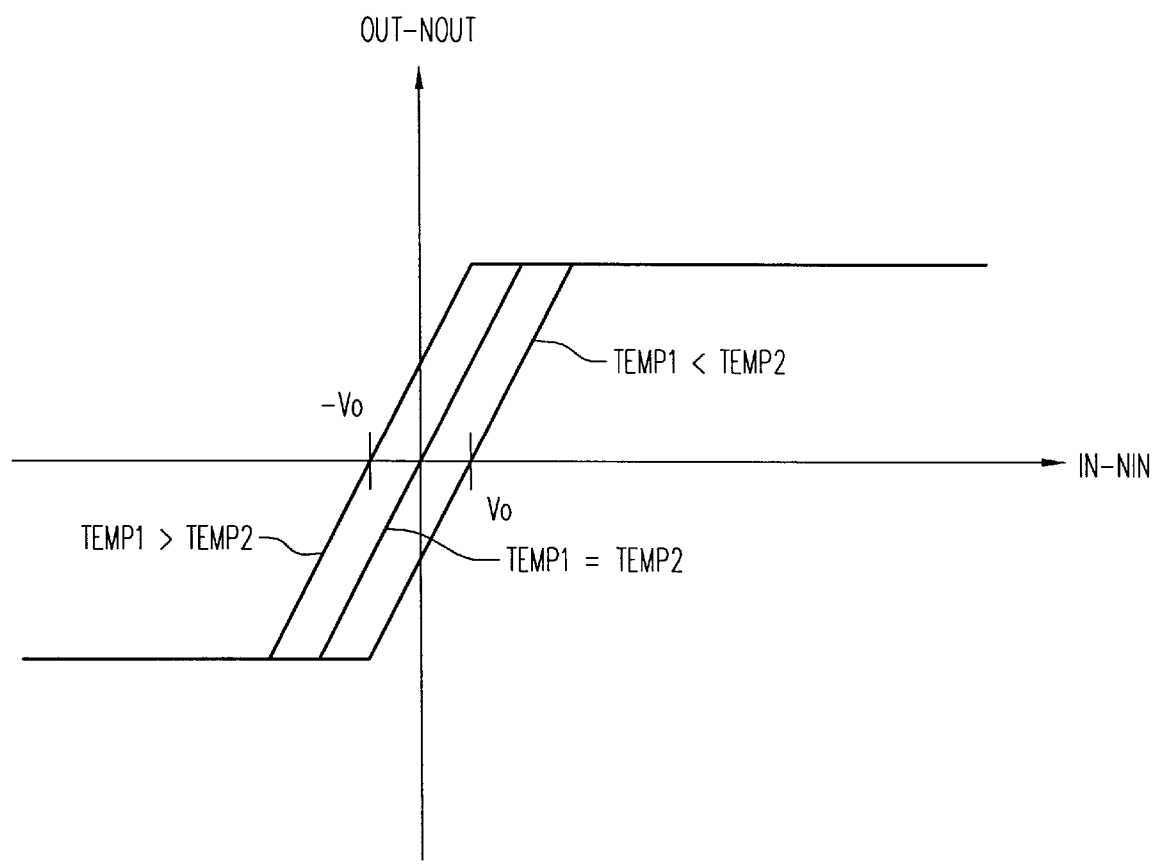

The principles of the invention shall now be explained for the example of the differential circuit as shown in FIG. 1. It is to be understood, however, that the principles of the invention are neither limited to amplifier applications nor to circuits employing differential signals, but can be applied on any kind of circuit.

Figure 7A:
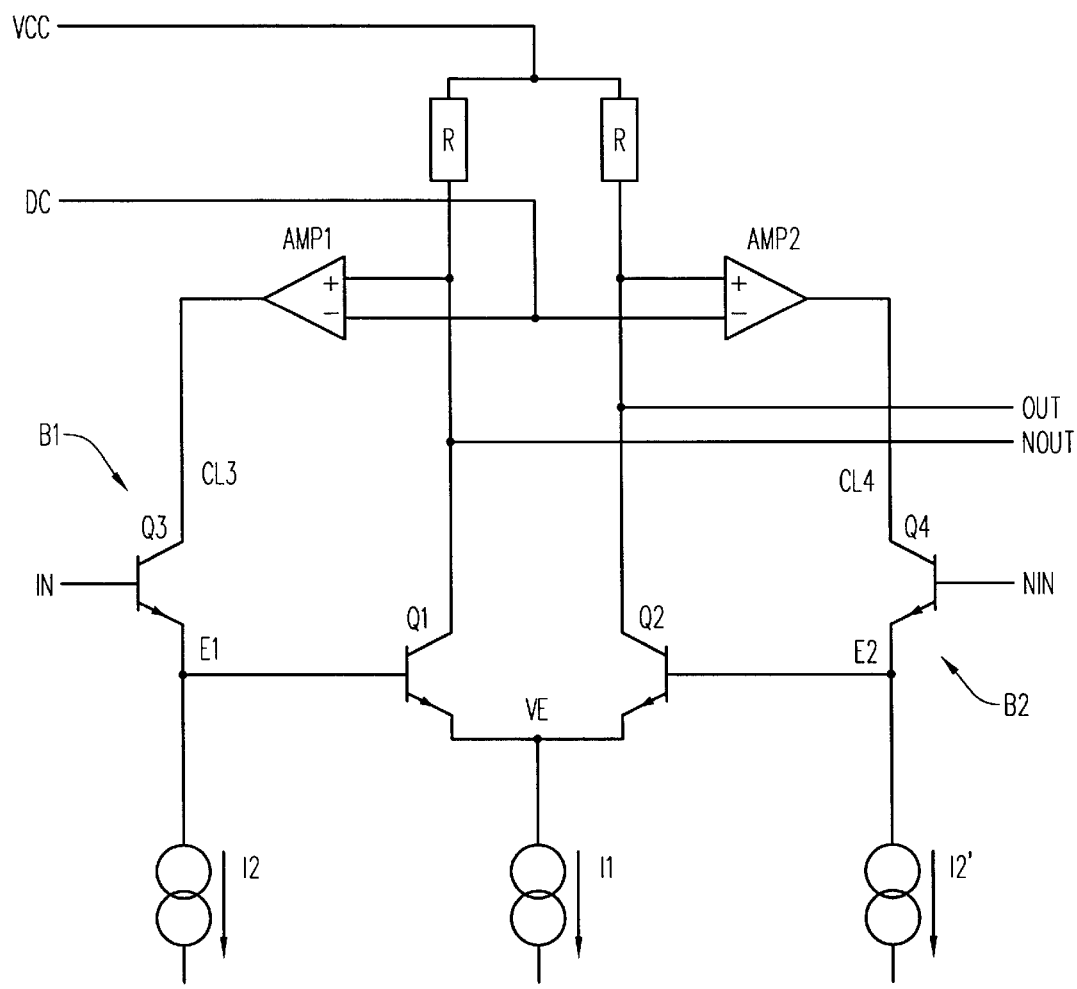
FIGS. 7A, 7B and 8 represent preferred embodiments of the invention.

FIG. 7A depicts a differential amplifier according to the invention. Timing errors due to signal-dependent temperatures of the transistors Q1 and Q2 are eliminated by adding respective buffer stages B1 and B2 in the input path between the input signals IN and NIN and the base of the transistors Q1 and Q2, respectively. The buffer stages B1 and B2 provide substantially the same thermal behavior, but with an opposite sign, as the transistors Q1 and Q2 in the differential circuit. The buffer stage B1 comprises a buffer transistor Q3 coupled as emitter-follower between the input signal IN and the base of transistor Q1. The emitter of transistor Q3 is coupled to a current source I2. Accordingly, the buffer stage B2 provides a transistor Q4 coupled as emitter-follower between the input signal NIN and the base of the transistor Q2. The emitter of Q4 is coupled to a current source I2' which substantially corresponds to the current source I2 so that it can be assumed that I2=I2'.

The logic state (low or high state) modulates the voltage across one or both of the buffer transistors Q3 and Q4, and therefore the power consumption and temperature of transistors Q3 and Q4, so that the resulting voltage error has the opposite direction with respect to respective one of the transistors Q1 and Q2 coupled to the current source I1.

The transistors Q3 and Q4 are selected to provide an electrical and thermal behavior proportional to the behavior of the transistors Q1 and Q2. Furthermore, the transistors Q3 and Q4 are arranged in a way that the thermal relationship between them is proportional to the thermal relationship between the transistors Q1 and Q2. This can be achieved in that the transistors Q3 and Q4 have proportional sizes and distances from each other with respect to the transistors Q1 and Q2. This makes sure that the thermal resistances and capacitances associated with transistors Q3 and Q4 are proportional to the ones of transistors Q1 and Q2.

Amplifiers AMP1 and AMP2 may provide a voltage to the buffer stages B1 and B2 that is proportional to the output voltage OUT and NOUT and may further add a DC voltage. Instead of providing two amplifiers AMP1 and AMP2, only one amplifier AMP may be furnished which then provides a higher voltage swing at nodes CL3 or CL4. The outputs of the amplifiers AMP1 and AMP2 (or AMP) modulate the voltage at the collectors CL3 and/or CL4 of the emitter-follower transistors Q3 and/or Q4.

Figure 8:
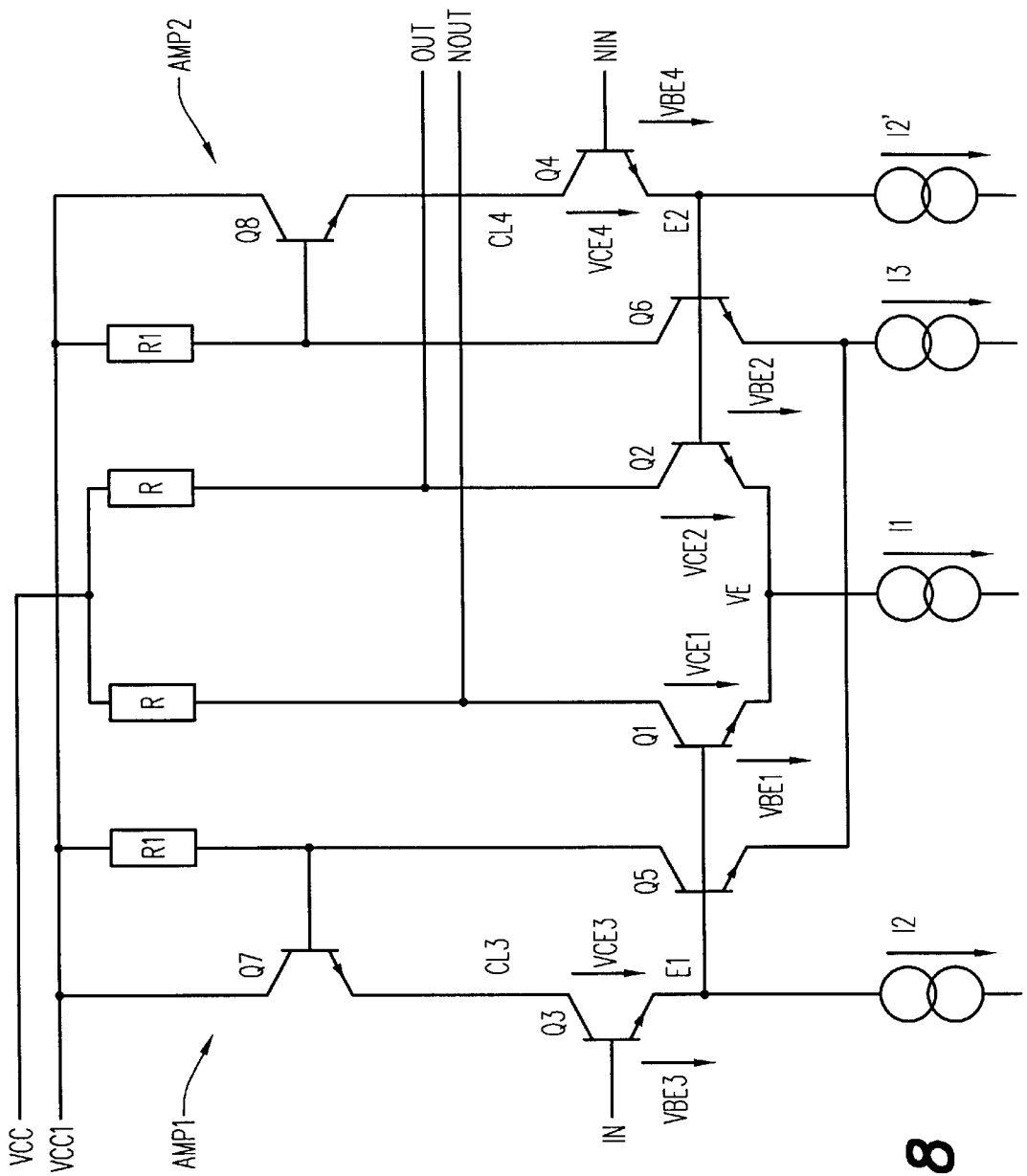

The inputs of the amplifiers AMP1 and AMP2 (or AMP) can be derived directly from the outputs OUT and NOUT as explained later, but may as well be generated as illustrated in FIG. 8. In the embodiment of FIG. 8, a second differential amplifier is coupled in parallel to the first differential amplifier (comprised of the transistors Q1 and Q2). The second differential amplifier is built up in accordance with the first differential amplifier and comprises transistors Q5 and Q6 with common emitters coupled to a current source I3 and collectors respectively coupled via impedances R1 to a source of high potential VCC1. The bases of the transistors Q5 and Q6 respectively receive the complementary input signals IN and NIN. Transistors Q7 and Q8 (as the amplifiers AMP1 and AMP2) respectively buffer a signal at the collectors of the transistors Q5 and Q6 which corresponds (proportionally, according to the relationship between components R, R1, I3, I1) to the output signals OUT and NOUT, and provide that signal to the collectors CL3 and CL4 of the transistors Q3 and Q4. The circuit of FIG. 8 provides an easier circuitry than the circuit of FIG. 7A since it requires fewer components. Moreover, the output nodes OUT and NOUT in FIG. 8 are not loaded.

From FIGS. 7A and 8, it becomes apparent that the buffer stages B1 and B2 respectively are subject to power consumption modulation provided by the transistor Q1 and Q2, whereby the buffer stages B1 and B2 are coupled between the differential input signal IN–NIN the respective control electrodes (bases) of the transistor Q1 and Q2. While the power consumption of the transistors Q3 and Q4 in FIG. 7A is directly modulated by the transistors Q1 and Q2, the embodiment of FIG. 8 provides an indirect modulation of the power consumption. In FIG. 8, the second differential amplifier is built up in accordance with the first differential amplifier, so that transistors Q1 and Q2 only indirectly modulate the power consumption in that they are built up and behave in accordance with the transistors Q5 and Q6.

A special case (FIGS. 7A and 8) shall now be regarded wherein the transistors Q3 and Q4 have the same size and distance from each other as the transistors Q1 and Q2, so that the thermal resistances and capacitances associated with the transistors Q3 and Q4 are the same as for the transistors Q1 and Q2. Transistors Q3 and Q4 are preferably located sufficiently apart from the transistors Q1 and Q2 in order to avoid or reduce a thermal influence between the pairs of transistors Q1/Q2 and Q3/Q4.

The power dissipation difference of the buffer transistors Q3 and Q4 between both logic states (low, high) are:

$$Pd3\_hi-Pd3\_lo=I2\cdot(VCE3\_hi-VCE3\_lo) \quad \text{eq. 6}$$

$$Pd4\_hi-Pd4\_lo=I2'\cdot(VCE4\_hi-VCE4\_lo) \quad \text{eq. 7}$$

In the embodiment of FIG. 8, this leads to:

$$VCE3\_hi - VCE3\_lo = -I3 \cdot R1 - (Vin\_hi - Vin\_lo) \quad \text{eq. 8}$$
$$VCE4\_hi - VCE4\_lo = I3 \cdot R1 - (Vnin\_hi - Vnin\_lo)$$

$$= I3 \cdot R1 + (Vin\_hi - Vin\_lo) \quad \text{eq. 9}$$

If the difference in power dissipation between both logic states is the same for transistor Q3 as for transistor Q1, but with opposite sign, the voltage change due to temperature effects compensate each other, so that the signal combination through the transistors Q1 and Q3 will not encounter a voltage offset error. The same applies for the transistors Q4 and Q2.

The conditions for full compensation of timing errors are:

$$Pd3\_hi-Pd3\_lo=-(Pd1\_hi-Pd1\_lo) \quad \text{eq. 10}$$

$$Pd4\_hi-Pd4\_lo=-(Pd2\_hi-Pd2\_lo) \quad \text{eq. 11}$$

In case of equations 10 and 11, the equations 1 and 2 have to be modified to reflect the additional voltage drop at the input signals IN and NIN due to the buffer transistors Q3 and Q4, whereby it is assumed that VBE3=VBE4=VBEf, and VBEf represents the base-emitter voltage of transistors Q3 and Q4, so that:

$$Pd1\_hi-Pd1\_lo=Pd=I1\cdot(VCC-R\cdot I1-(Vin\_hi-VBEf-VBE)) \quad \text{eq. 12}$$

$$Pd2-hi-Pd2\_lo=-Pd=-I1\cdot(VCC-R\cdot I1-(Vin\_hi-VBEf-VBE)) \quad \text{eq. 13.}$$

Equations 6, 8, 10 and 12 lead to the condition:

$$I2\cdot(-I3\cdot R1-(Vin\_hi-Vin\_lo))=-I1\cdot(VCC-R\cdot I1-(Vin\_hi-VBEf-VBE)) \quad \text{eq. 14}$$

Accordingly, equations 7, 9, 11 and 13 lead to the condition:

$$I2'\cdot(I3\cdot R1+(Vin\_hi-Vin\_lo))=-I1\cdot(VCC-R\cdot I1-(Vin\_hi-VBEf-VBE)) \quad \text{eq. 15}$$

It is noted that the equations 14 and 15 represent the same condition.

Figure 4A:
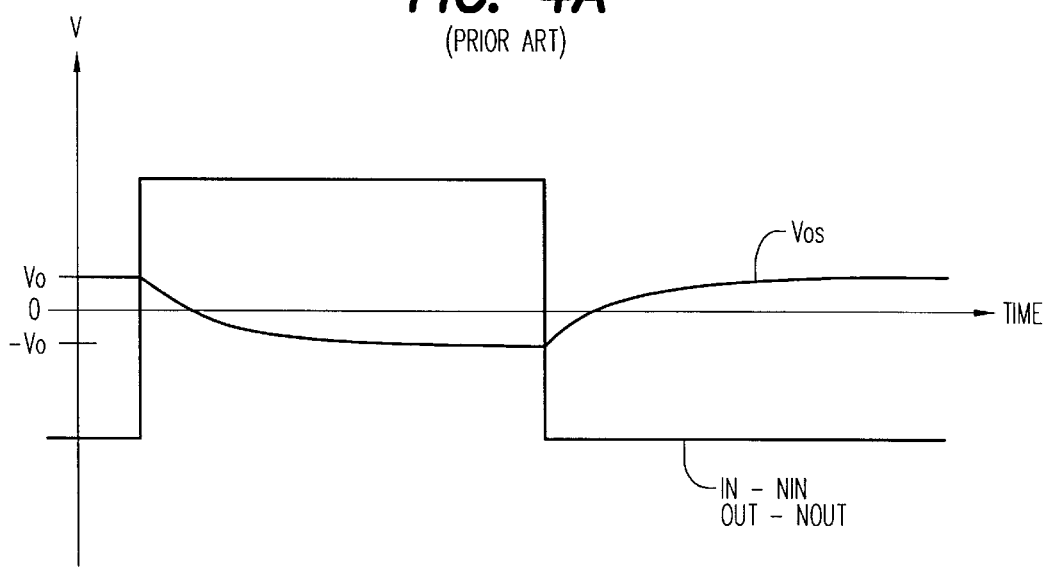
Figure 4B:
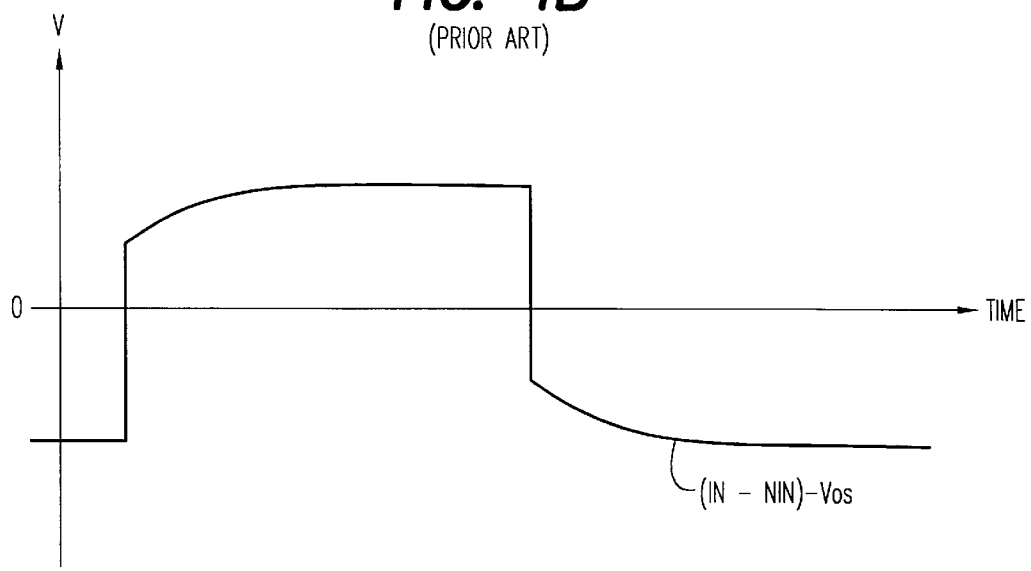
Figure 5A:
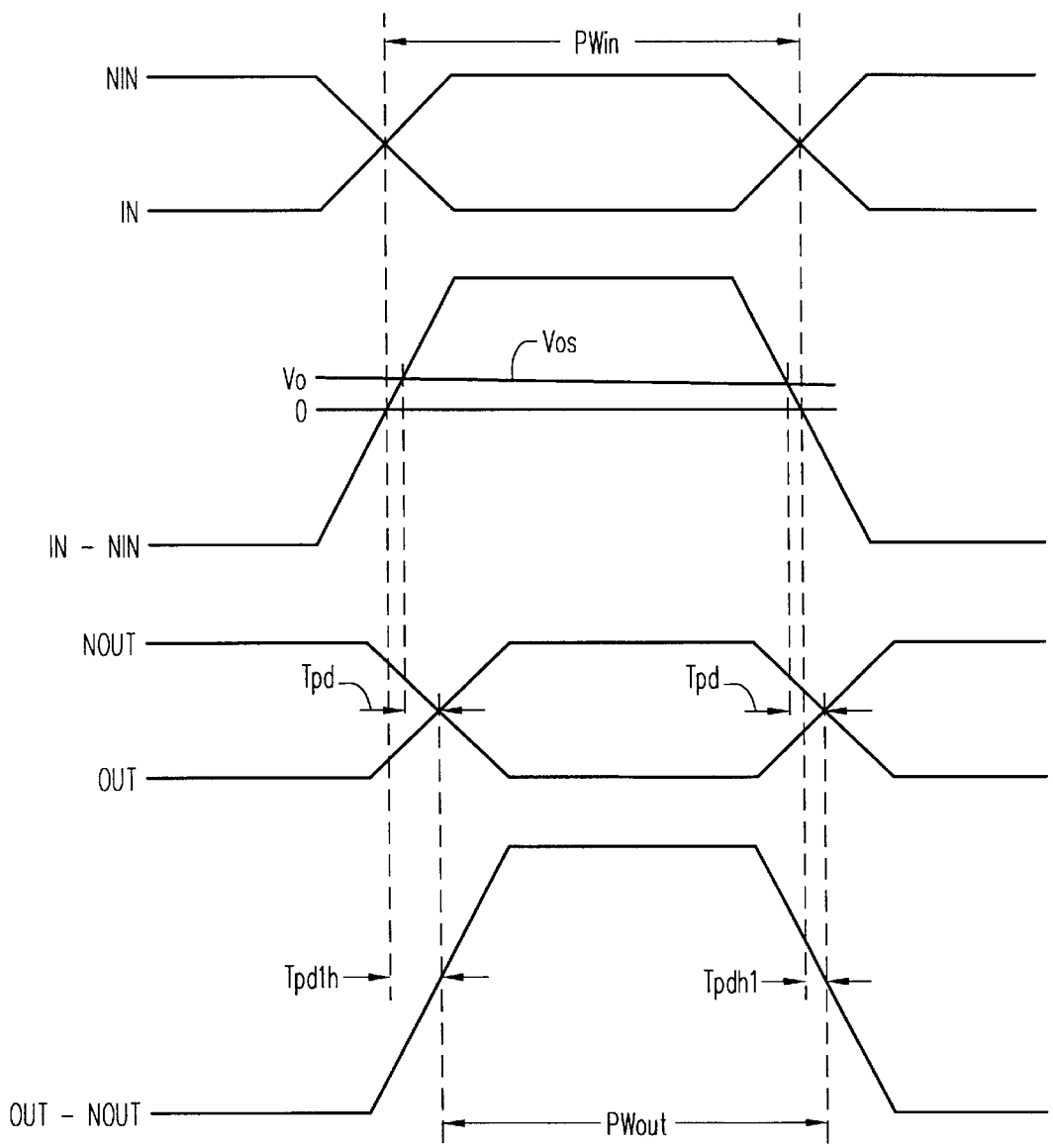
Figure 5B:
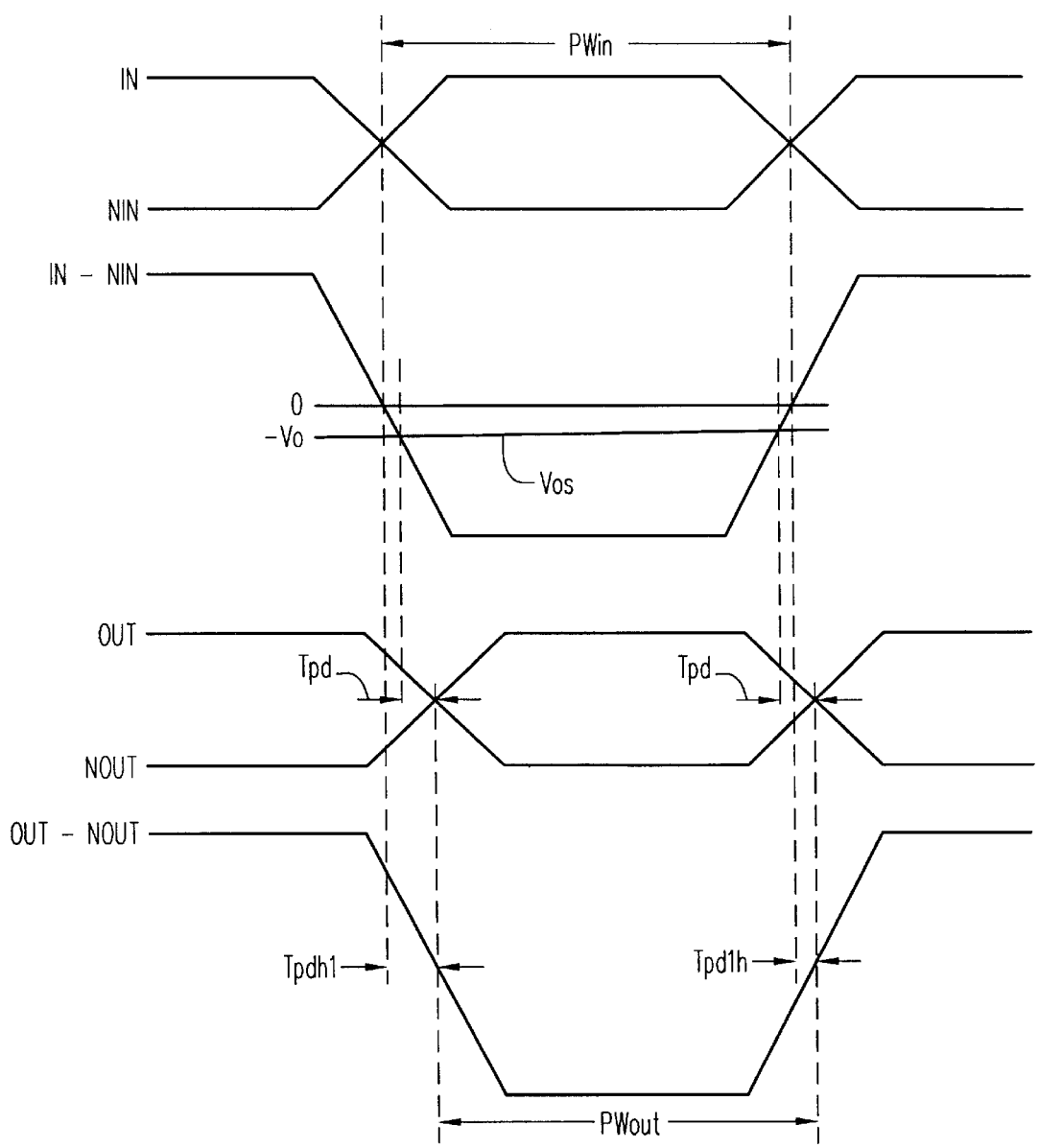
Figure 9A:
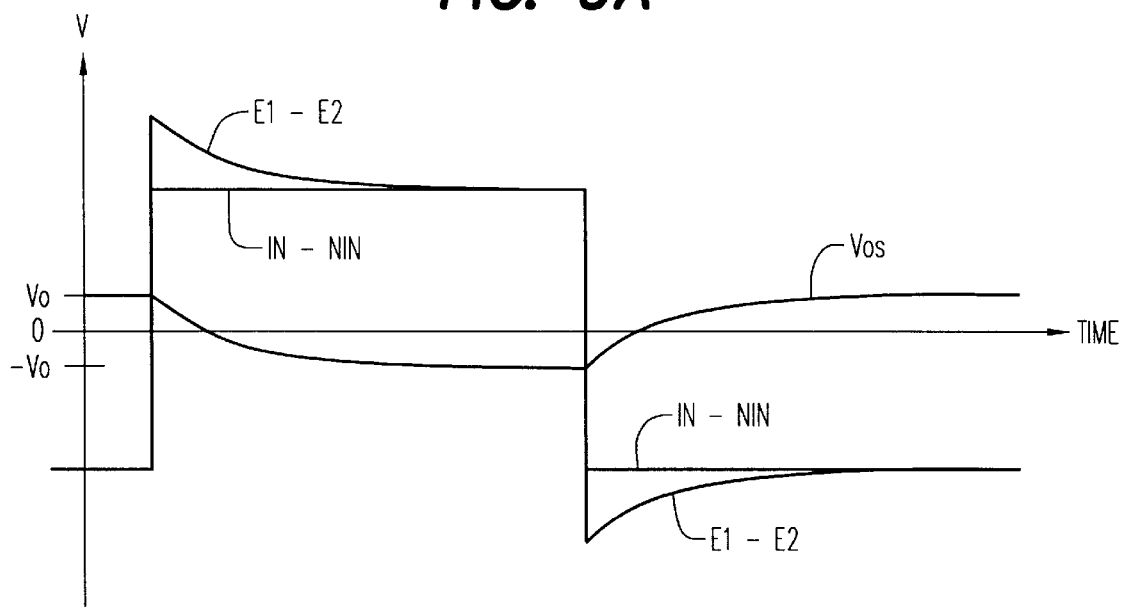
FIGS. 9A and 9B represent actual and virtual signals in the differential amplifiers of FIGS. 7A and 8.
Figure 9B:
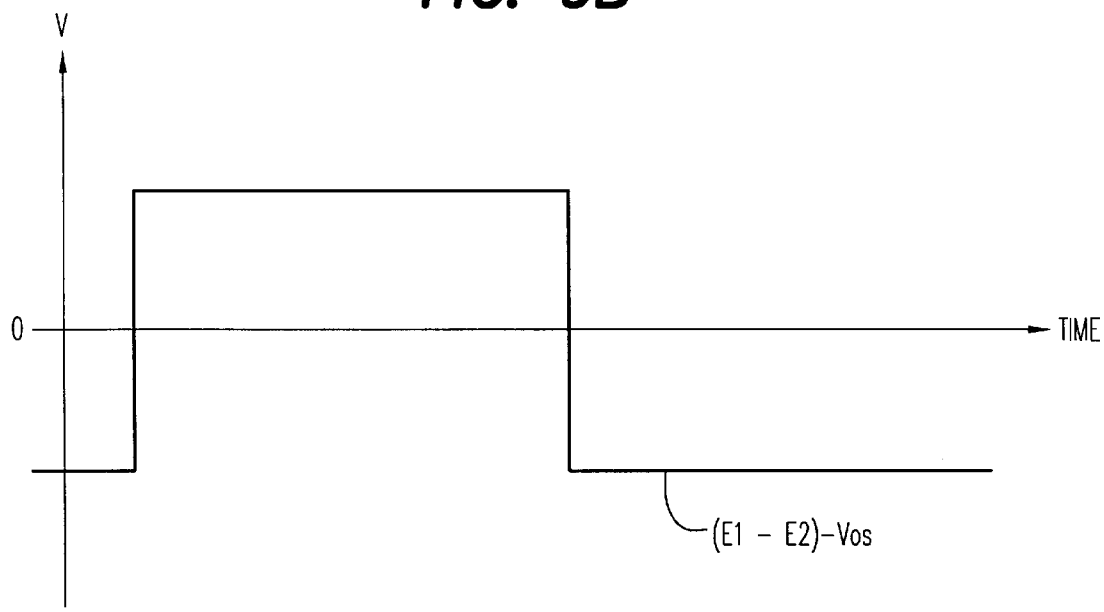

The signals of the circuits in FIG. 7A or FIG. 8 are depicted in FIGS. 9A and 9B. The signals in FIG. 9A and 9B correspond to the signals as depicted in FIGS. 4A and 4B. Due to the modified signal at the emitters of transistors Q3 and Q4 and thus at the base of transistors Q1 and Q2, however, the "effective signal" (E1–E2)–Vos (cf. FIG. 9B) at the differential amplifier substantially corresponds to the input signal IN–NIN (cf. FIG. 9A), whereby E1 represents the signal at node E1 and E2 represents the signal at node E2. It is apparent from FIG. 9A that the effect of the offset voltage Vos can be efficiently compensated by modifying the signal E1–E2 at the base of transistors Q1 and Q2.

A simplification in the circuits in FIG. 7A or FIG. 8 can be made under the assumptions:

$$I1=I2=I \quad VBE=VBEf=0.8V$$

This leads to the simplified condition (from equation 14 or 15):

$$I3\cdot R1+(Vin\_hi-Vin\_lo)=VCC-R\cdot I-(Vin\_hi-1.6V) \quad \text{eq. 16}$$

$$I3\cdot R1=VCC+1.6V-Vin\_hi-(Vin\_hi-Vin\_lo)-R\cdot I \quad \text{eq. 17}$$

A more general condition for zero timing error would be if the difference in power dissipation between logical high and low state of the transistors Q1 and Q3 is the same as for the transistors Q2 and Q4:

$$(Pd3\_hi-Pd3\_lo)+(Pd1\_hi-Pd1\_lo)=(Pd4\_hi-Pd4\_lo)+(Pd2\_hi-Pd2\_lo) \quad \text{eq. 18}$$

This may be useful if unsymmetrical currents and/or voltages are required.

Figure 6A:
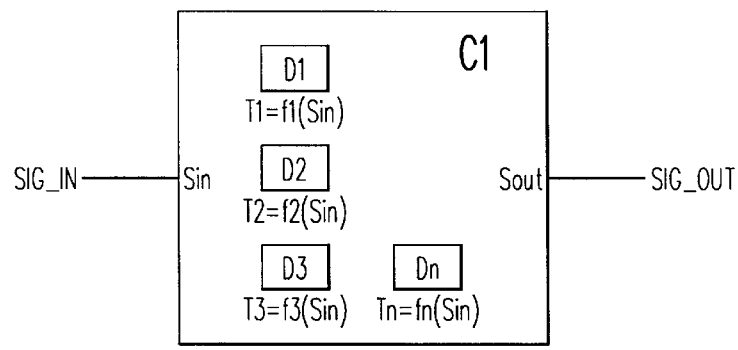
Figure 6B:
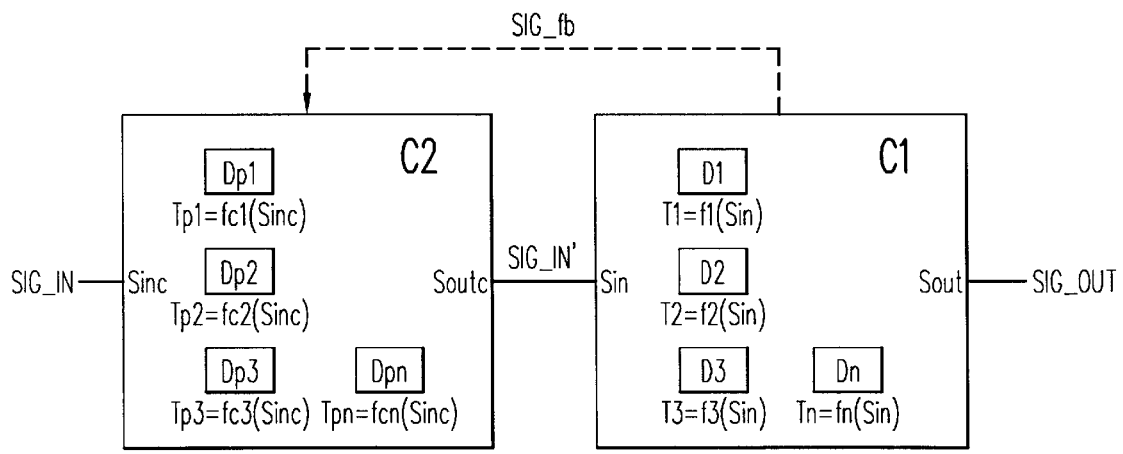
Figure 7B:
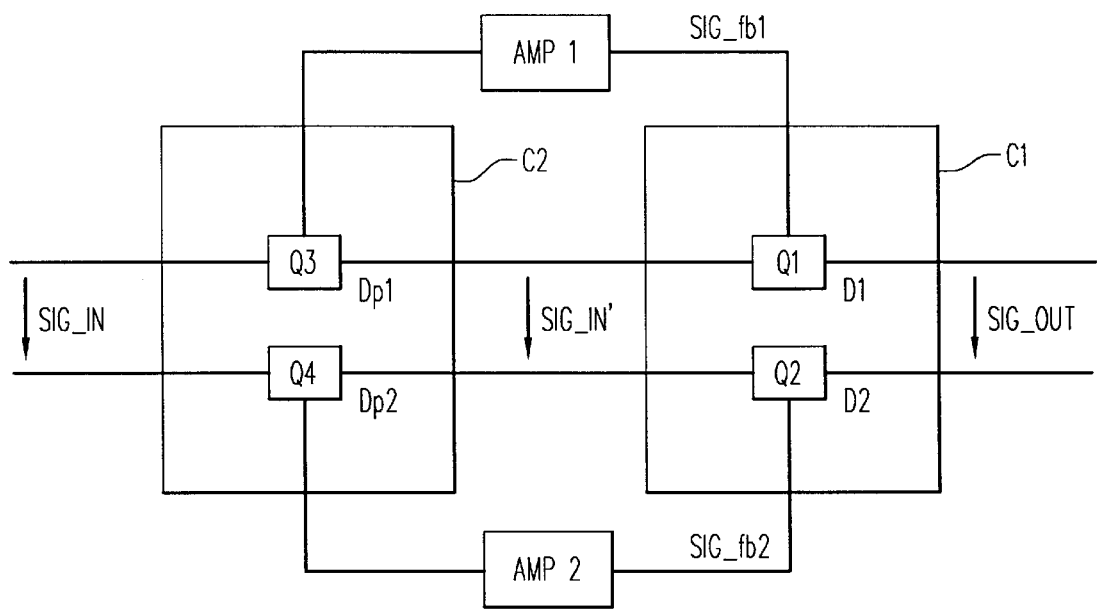

The principles of the circuits of FIGS. 7A and 8 shall now be explained in a general block diagram of FIG. 7B, which corresponds to FIG. 6B. Transistors Q3 and Q4 (as devises Dp1 and Dp2) receive the signal SIG_IN and provide a compensated signal SIG_IN' to the transistors Q1 and Q2 (as devises D1 and D2) of the differential amplifier C1 (cf. FIG. 1). Transistors Q1 and Q2, in turn, provide the output SIG_OUT that is substantially free of timing errors. Transistors Q1 and Q2 further provide optional feed-back loops SIG_fb1 and SIG_fb2 via the amplifiers AMP1 and AMP2. It is to be understood that the circuit of FIG. 8 represents a circuit without feed back loop.

Due to the defined spatial arrangement of the transistors Q1–Q4 with proportional sizes and distances from each other, the transistors Q3 and Q4 provide a temperature dependent electrical behavior inverse to the behavior of the transistors Q1 and Q2, because the thermal relationship between transistors Q3 and Q4 is proportional to the thermal relationship between the transistors Q1 and Q2. Thus, the signal SIG_IN' of circuit C2 provides the inverse timing errors with respect to the signal SIG_IN as the circuit C1 does with respect to the signal SIG_IN', so that, in total, the signal SIG_OUT substantially exhibits the same timing information as the signal SIG_IN and is substantially free of timing errors.

As apparent from the above said, the timing errors and bandwidth limitations of the differential amplifier caused by dynamic thermal mismatches can thus be eliminated by adding the buffer circuits as depicted in FIGS. 7A and 7B and which thermally work 'against' the error cause.

It is clear that although the invention has been described with respect to bipolar technology, other suitable technologies, such as FET, or combined technologies can be applied accordingly. In case of FET technology, source followers are applied instead of emitter followers.

What is claimed is:

1. A compensation circuit for compensating for a change in timing information of an input signal caused by thermal variations in a first circuit;
   said first circuit comprising one or more devices each having an individual temperature dependent on said input signal,
   said compensation circuit comprising one or more compensation devices each having an individual temperature dependent on said input signal, and
   said compensation circuit being connected in series with said first circuit to form a second circuit, said second circuit receiving said input signal and providing a timing-compensated output signal with substantially the same timing information as said input signal; whereby:
   a thermal characteristic of at least one of said one or more compensation devices is one of proportional or a known relation to a corresponding one of said one or more devices of the first circuit, and
   said compensation circuit provides a compensation output signal having substantially opposite thermal distortions than said first circuit.

2. The compensation circuit of claim 1, further comprising one or more feed-back signals coupled from said first circuit to said compensation circuit.

3. The compensation circuit of claim 1, wherein:
said first circuit comprises a differential amplifier comprising a first transistor and a second transistor coupled to a first current source, whereby first electrodes of said first and second transistor provide said output signal, and
said compensation circuit comprises:
a first buffer stage subject to one of direct or indirect power consumption modulation provided by said first transistor, whereby said first buffer stage is coupled between said input signal and a control electrode of said first transistor, and
a second buffer stage subject to one of direct or indirect power consumption modulation provided by said second transistor, whereby said second buffer stage is coupled between said input signal and a control electrode of said second transistor.

4. A differential amplifier receiving an input signal and providing an output signal, comprising:
a first transistor and a second transistor coupled to a first current source, whereby first electrodes of said first and second transistor provide said output signal,
a first buffer stage subject to one of direct or indirect power consumption modulation provided by said first transistor, whereby said first buffer stage is coupled between said input signal and a control electrode of said first transistor, and
a second buffer stage subject to one of direct or indirect power consumption modulation provided by said second transistor, whereby said second buffer stage is coupled between said input signal and a control electrode of said second transistor; whereby:
a thermal characteristic of each of said first and second buffer stages is one of proportional or a known relation to said first and second transistors, respectively, and
each of said first and second buffer stages provides a compensation output signal having substantially opposite thermal distortions than said first and second transistors, respectively, such that said differential amplifier receives said input signal and provides a timing-compensated output signal with substantially the same timing information as said input signal.

5. The compensation circuit of claim 3, wherein:
said first buffer stage comprises a third transistor receiving said input signal at a control electrode thereof, wherein a first electrode thereof is coupled to said control electrode of said first transistor and to a second current source;
said second buffer stage comprises a forth transistor receiving said input signal at a control electrode thereof, wherein a first electrode thereof is coupled to the control electrode of said second transistor and to a third current source.

6. The compensation circuit of claim 3, wherein said third and the forth transistors have proportional sizes and distances from each other with respect to said first and the second transistors.

7. The compensation circuit of claim 1, wherein said input signal is a differential input signal and said output signal is a differential output signal.

8. The compensation circuit of claim 1, wherein said thermal characteristic represents a direct thermal property determined by the respective device itself.

9. The compensation circuit of claim 1, wherein said thermal characteristic comprises an indirect thermal property determined by the respective device relative to other devices.

10. The differential amplifier of claim 4, wherein:
said first buffer stage comprises a third transistor receiving said input signal at a control electrode thereof, wherein a first electrode thereof is coupled to said control electrode of said first transistor and to a second current source;
said second buffer stage comprises a forth transistor receiving said input signal at a control electrode thereof, wherein a first electrode thereof is coupled to said control electrode of said second transistor and to a third current source.

11. The differential amplifier of claim 5, wherein said third and the forth transistors have proportional sizes and distances from each other with respect to said first and the second transistors.

12. The differential amplifier of claim 4, wherein said input signal is a differential input signal and said output signal is a differential output signal.

13. The differential amplifier of claim 4, wherein said thermal characteristic comprises a direct thermal property determined by the respective device itself.

14. The differential amplifier of claim 4, wherein said thermal characteristic comprises an indirect thermal property determined by the respective device relative to other devices.

15. The compensation circuit of claim 8, wherein said thermal characteristic comprises a temperature dependency of the electrical characteristics of the device.

16. The compensation circuit of claim 8, wherein said thermal characteristic comprises thermal resistance of the device.

17. The compensation circuit of claim 8, wherein said thermal characteristic comprises a capacitance of the device.

18. The compensation circuit of claim 9, wherein said thermal characteristic comprises at least one of a thermal resistance and a capacitance relative to other device,.

19. The compensation circuit of claim 9, wherein said thermal characteristic comprises an electrical relationship between corresponding devices.

20. The differential amplifier of claim 13, wherein said thermal characteristic comprises a temperature dependency of the electrical characteristics of the device.

21. The differential amplifier of claim 13, wherein said thermal characteristic comprises a thermal resistance of the device.

22. The differential amplifier of claim 13, wherein said thermal characteristic comprises a capacitance of the device.

23. The differential amplifier of claim 14, wherein said thermal characteristic comprises at least one of a thermal resistance and a capacitance relative to other devices.

24. The differential amplifier of claim 14, wherein said thermal characteristic comprises an electrical relationship between corresponding devices.

* * * * *